(12) United States Patent
Yamauchi et al.

(10) Patent No.: US 7,341,877 B2
(45) Date of Patent: Mar. 11, 2008

(54) CALIBRATION METHOD IN A CHIP MOUNTING DEVICE

(75) Inventors: Akira Yamauchi, Shiga (JP); Yoshiyuki Arai, Shiga (JP)

(73) Assignee: Toray Engineering Co., Ltd., Osaka (JP)

( * ) Notice: Subject to any disclaimer, the term of this patent is extended or adjusted under 35 U.S.C. 154(b) by 309 days.

(21) Appl. No.: 11/016,720

(22) Filed: Dec. 21, 2004

(65) Prior Publication Data

US 2005/0104230 A1    May 19, 2005

Related U.S. Application Data

(62) Division of application No. 10/416,452, filed on May 12, 2003, now Pat. No. 6,892,447.

(51) Int. Cl.
*H01L 21/66* (2006.01)

(52) U.S. Cl. .................................................. 438/14

(58) Field of Classification Search .................. 438/5, 438/7, 11–18, 22–24, 29, 31, 34–36, 128–130, 438/149, 484, 538
See application file for complete search history.

(56) References Cited

U.S. PATENT DOCUMENTS

| | | | |
|---|---|---|---|
| 5,035,047 A | | 7/1991 | Harigane et al. |
| 5,839,187 A | | 11/1998 | Sato et al. |
| 5,878,484 A | | 3/1999 | Araya et al. |
| 6,096,567 A | * | 8/2000 | Kaplan et al. ............... 438/14 |
| 6,152,679 A | | 11/2000 | Araya et al. |
| 6,376,329 B1 | * | 4/2002 | Sogard et al. ............... 438/401 |
| 6,435,808 B1 | | 8/2002 | Araya et al. |
| 6,632,722 B2 | * | 10/2003 | Fujiwara et al. ............ 438/401 |

FOREIGN PATENT DOCUMENTS

| | | |
|---|---|---|
| JP | 07-245500 A1 | 9/1995 |
| JP | 10-125728 A1 | 5/1998 |
| JP | 10-150059 A1 | 6/1998 |

OTHER PUBLICATIONS

International Search Report for PCT/JP00/08031 mailed on Dec. 26, 2000.
International Preliminary Examination Report completed on Apr. 11, 2001.

* cited by examiner

*Primary Examiner*—Michael Lebentritt
*Assistant Examiner*—Andre' Stevenson
(74) *Attorney, Agent, or Firm*—Cheng Law Group PLLC (57) ABSTRACT

A method of accurately calibrating a movement control system of mark recognition means in a chip mounting device, comprising the steps of: recognizing a first recognition mark put on a head (2) and a second recognition mark (13) put on a stage (26) with two-field recognition means (7) so as to calibrate and update the preceding control parameters inputted into the movement control system of the two-field recognition means (7); and, with the head (2) lowered to position the first recognition mark closely to the second recognition mark (13), recognizing both marks with third recognition means (20) when the two-field recognition means (7) is moved back so as to calibrate and update the preceding control parameters inputted into the movement control system of the two-field recognition means (7).

2 Claims, 9 Drawing Sheets

CALIBRATION METHOD IN A CHIP MOUNTING DEVICE

CROSS REFERENCE TO RELATED APPLICATIONS

The present application is a Divisional Application of the patent application Ser. No. 10/416,452, filed on May 12, 2003, now U.S. Pat. No. 6,892,447 which is based on International Application No. PCT/JP00/08031 filed on Nov. 14, 2000, the entire contents of which are incorporated herein by reference.

TECHNICAL FIELD

The present invention relates to a chip mounting device for mounting a chip on a substrate, and a method of calibrating the device.

BACKGROUND ART

Chip mounting has been conventionally performed in a manner such that, as well known, a head holding a chip on an upper level is lowered in a state where a mounting position on a substrate supported on a substrate holding stage on a level below the head is precisely positioned relative to the chip.

Therefore, in advance of such mounting, for example, alignment between the chip and the substrate is performed in a process that recognition marks put on the chip and the substrate are recognized with two-field recognition means and the substrate holding stage is then subjected to movement control in a prescribed manner so as to eliminate a positional discrepancy between both recognition marks, in which the two-field recognition means is moved either in a direction from a retreat position to a recognition position for a recognition mark or in a direction opposed to the former direction for retreat.

Since, as such a process is repeatedly applied to proceed mounting, however, changes in dimension occur in sections of the device due to changes in environmental conditions such as a rise in temperature in a working room, error occurs in positional recognition for a recognition mark if movement control of the two-field recognition means is permanently continued in the same condition, causing difficulty in mounting with a high precision.

Therefore, in order to keep a mounting precision to a μm unit, not only has calibration of a movement control system of the recognition means been performed at any time when required, but various kinds of calibration have also been proposed.

In the description of paragraphs [0036] to [0042] in the specification of JP 97-8104, A, for example, a calibration method is proposed in which a mark table (21) is mounted on a Z table to which a head (corresponding to a bonding tool (17)) is attached with an upward/downward movement mechanism inserted therebetween; the upward/downward movement mechanism is driven not only to move the mark table (21) to a position on the same level as a chip (corresponding to a semiconductor chip (1)) vacuum-suction held by the head, but also to move two-field recognition means (corresponding to integrated cameras (19) and (20)) to a position below the mark table (21) and to thereby recognize a calibration recognition mark (corresponding to a calibration mark (7)) provided on the mark table (21); then, the two-field recognition means is retreated from the recognition position, thereafter the upward/downward movement mechanism is driven not only to move the mark table (21) to a position on the same level as a substrate (corresponding to a circuit substrate (10)) supported on a substrate holding stage (corresponding to a bonding stage (18)) on a lower level, but also to move the two-field recognition means to above the mark table (21) and to recognize the calibration recognition mark; and thereby correcting and updating is performed of a preceding control parameter inputted to the movement control system of the two-field recognition means based on prescribed control parameters obtained by the two recognition operations.

This calibration method, however, has been prevented from performing calibration with a higher precision for reasons that since in the method, the calibration recognition mark provided separately from the recognition marks put on the chip and the substrate, respectively, is recognized at a position spaced widely apart from a recognition position for the recognition marks, a load (a bending moment) acting on a moving table moving the two-field recognition means alters according to whether the two-field recognition means is moved to a recognition position for one (for example, the calibration recognition mark) of the recognition marks or the others thereof (for example, the recognition marks); therefore, a difference between deflections of the moving table caused by different loads results in error in positional recognition of the calibration recognition mark.

The present invention has been made in light of such a fault in the prior art as a result of a serious study conducted in order to rectify the fault based on findings that calibration can be performed with a higher precision by recognizing a first recognition mark put on a head and a second recognition mark put on a stage with first recognition means and second recognition means, respectively, instead of using a conventional mark table and in addition thereto, recognizing the first recognition mark and the second recognition mark in a state of being close to each other with third recognition means.

Note that the present invention makes it possible to mount any of objects in all forms (referred collectively to as a chip) on the side bonded to a substrate, such as an IC chip, an optical element and a wafer, regardless of a kind or a size, onto any of objects in all forms (referred collectively to as a substrate) on the side to which a chip is bonded, such as not only the liquid crystal substrate, but also a resin substrate, a film substrate, an IC chip and a wafer, regardless of a kind or a size, with a high precision.

DISCLOSURE OF THE INVENTION

A chip mounting device according to the present invention comprises: a head, not only having a function to hold a chip, but also provided with a first recognition mark; a stage, disposed below the head, and not only having a function to hold a substrate but also provided with a second recognition mark; first recognition means, recognizing the first recognition mark, and capable of moving; second recognition means, recognizing the second recognition mark, and capable of moving; and third recognition means recognizing both of the first recognition mark and the second recognition mark from the stage side in a state where the first recognition mark and the second recognition mark are close to or in contact with each other, obtained by moving the head toward the stage side, wherein a prescribed control parameter is acquired by recognizing the first recognition mark and the second recognition mark in a state where the first recognition means and the second recognition means have been moved into between the head and the stage, a prescribed control parameter is acquired by recognizing the first recognition mark and the second recognition mark with the third recognition means in a state where the head have been moved to the stage side, and a control parameter of a recognition means movement control system is corrected and updated based on the prescribed control parameters.

A calibration method in a chip mounting device according to the present invention comprises the steps of: recognizing a first recognition mark and a second recognition mark to acquire a prescribed control parameter in a state where first recognition means and second recognition means have been moved into between a head, having a function to hold a chip, and provided with the first recognized mark and a stage, disposed below the head, having a function to hold a substrate, and provided with the second recognition mark; recognizing both of the first recognition mark and the second recognition mark with third recognition means to acquire a prescribed control parameter in a state where the first recognition mark and the second recognition mark are close to or in contact with each other, obtained by moving the head toward the stage side; and correcting and updating a control parameter of a recognition means movement control system based on the prescribed control parameters.

Note that a chip mounting device in the present invention is a mounting device mounting a chip or a bonding device bonding a chip, and a device of a concept including all of a heating type, a non-heating type, a pressure type and a non-pressure type.

According to the present invention, as described above, a chip mounting device and a calibration method in the device can be obtained in which by reducing the number of movement control steps of the mark recognition means and intermittently performing calibrations, a time required for calibration can be shortened and furthermore, calibration with a high precision can be ensured under no influence of a mechanical deformation that would otherwise be caused by a moment occurring due to a difference between positions in alignment and calibration of the two-field recognition means.

BEST MODE FOR CARRYING OUT THE INVENTION

The following will be given as modes for solving the conventional problem.

Figure 1:
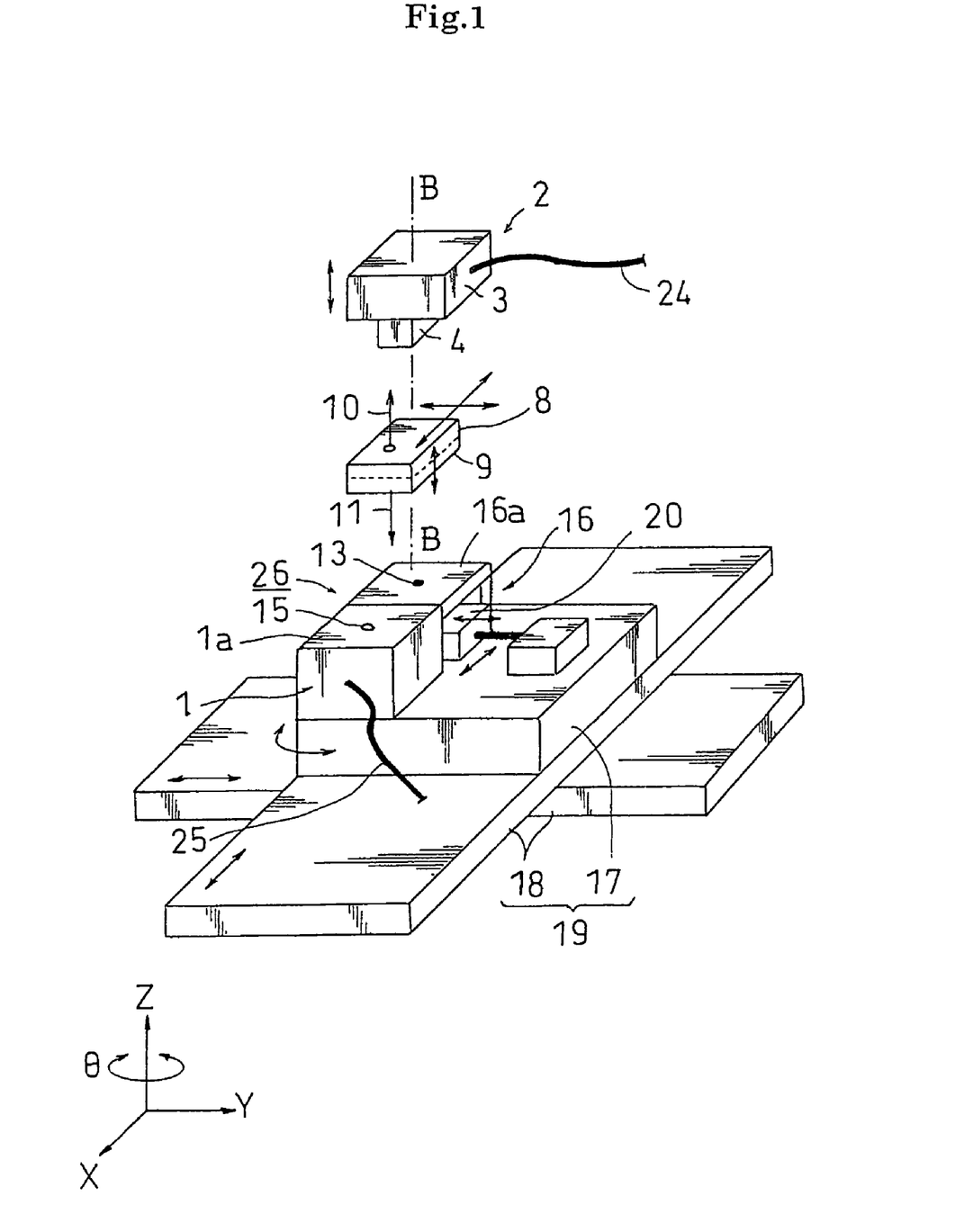
FIG. 1 is a perspective view showing a state of recognizing a second recognition mark in a chip mounting device.
Figure 2:
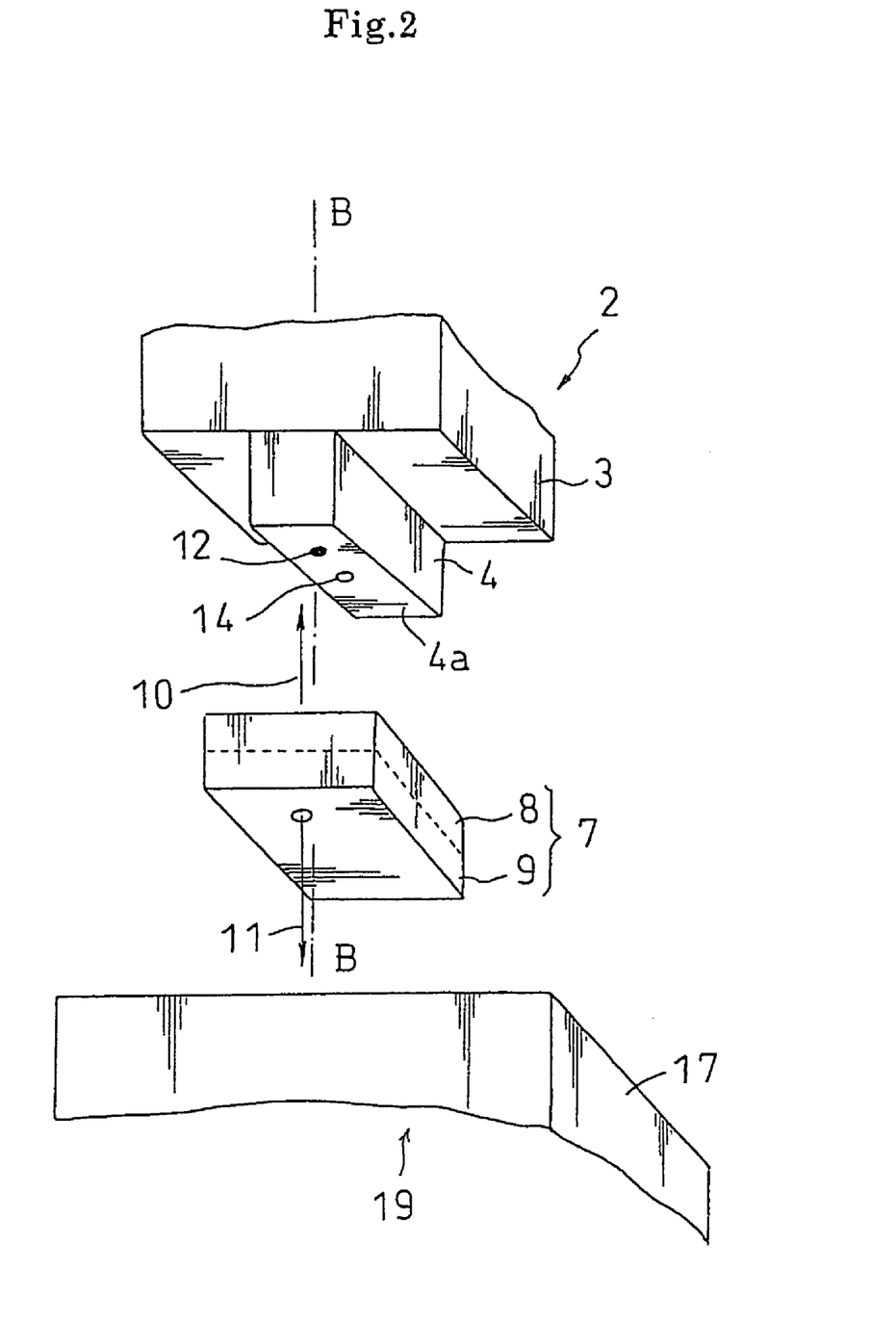
FIG. 2 is a perspective view showing a state of recognizing a first recognition mark in a chip mounting device.

In FIGS. 1 and 2, which are perspective views, there is shown a state where two-field recognition means 7 obtained by integrating first recognition means 8 and second recognition means 9 into a single piece (showing all modes (means), regardless of a kind, capable of recognizing a recognition mark, for example, a CCD camera, an infrared camera, an X ray camera, a sensor or the like) have been moved into between a substrate holding stage 1 on a lower level and a head 2 on an upper level, wherein not only is a first recognition mark 12 recognized by the first recognition means 8, but a second recognition mark 13 is also recognized by the second recognition means 9.

Note that not only is the second recognition mark 13 (showing all modes capable of being recognized as a recognition mark without a specific limitation to marks with specified purposes such as marks for use in calibration and alignment, regardless of a kind such as a hole, a groove or a print and a size) put on the upper surface 16a of a calibration plate 16 (this part can be seen therethrough) of a stage 26 of a partially see-through type, but a chip holding suction hole 14 is provided on a pressure surface 4a of a tool 4 forming a fore end of the head 2.

The substrate holding stage 1 is mounted on a rotary table 17 on translation tables 18 in a movable table 19. Therefore, by driving the movable table 19, not only can movements be realized in the X axis direction, the Y axis direction or the X and Y directions in a horizontal plane (hereinafter simply referred to as a translation), but a rotation in a prescribed direction can also be performed.

On the other hand, the head 2 is constituted of a block 3 and the tool 4, and mounted in a freely upwardly/downwardly movable manner in the Z axis direction (a vertical direction) by a mechanism not shown, though movement in a horizontal direction is disabled, and not only is a heater (not shown) for heating the tool 4 at a prescribed temperature built therein, but a suction hole 14 for suction holding a chip is opened at a pressure surface 4a of the tool 4. Furthermore, the first recognition mark 12 (showing all modes capable of being recognized as a recognition mark without a specific limitation to marks with specified purposes such as marks for use in calibration and alignment, regardless of a kind such as a hole, a groove or a print and a size) is put on the pressure surface 4a of the tool 4.

Note that the suction hole 14 is located on a vertical axial center line B-B of the head 2 and not only is one end of a pressure hose 24 connected to the head 2 so as to communicate with the hole 14, but the other end thereof is connected to a vacuum pump not shown.

The two-field recognition means 7 is mounted on a movable table, not shown, capable of translation control and/or upward/downward movement control thereon. Therefore, not only can the recognition means 7 be moved into between the head 2 and the stage 26 from a retreat position by driving the movable table, but vice versa. On this occasion, a position in height of the two-field recognition means 7 is adjusted to a prescribed position by control on an upward/downward movement of the movable table.

Third recognition means 20 (showing all modes (means), regardless of a kind, capable of recognizing a recognition mark, for example, a CCD camera, an infrared camera, an X ray camera, a sensor or the like) is mounted on the rotary table 17 of the movable table 19.

Note that an image pick-up head of the third recognition means 20 is normally located below the calibration plate 16. Such a recognition means 20 is not limited to a stationary type, but can be installed in any of modes capable of various kinds of controls, such as translation control and/or rotation control, translation control, rotary control and upward/downward movement control, translation control and upward/downward movement control, and rotary control and upward/downward movement control thereon.

The upper surface 1a of the substrate holding stage 1 and the upper surface 16a of a calibration plate 16 are installed so as to form one continuous plane without any difference on level. A suction hole 15 for suction holding a substrate (showing all modes on the side to which a chip is bonded, such as a resin substrate, a glass substrate, a film substrate, a chip and a wafer, regardless of a kind or a size) is opened in the central portion on the upper surface 1a of the substrate holding stage 1.

The suction hole 15 communicate with the pressure hose 25, not only is one end of which connected to the substrate holding stage 1, but the other end (not shown) of which is also connected to a vacuum pump.

Therefore, the movable table 19 can be translated and rotated to thereby, as shown in FIG. 1, position the substrate holding stage 1 to a position at which calibration is actually performed, and such a position at which calibration is actually performed is set to a prescribed position within a range of fields of view of the two-field recognition means 7 and the third recognition means 20, that is within a range where both recognition means 7 and 20 can recognize the first recognition mark 12 and the second recognition mark 13.

Note that in a state where the substrate holding stage 1 has been positioned at a position at which calibration is actually performed, the calibration plate 16 is located below the head 2, a position of the second recognition mark 13 put on the calibration plate 16 is not positioned so as to be aligned on the same vertical line relative to the plane of the calibration plate 16 as the first recognition mark 12 put on the head 2.

In this situation, the two-field recognition means 7 is then moved into between the head 2 having been moved at an upper waiting position and the calibration plate 16 below the head 2 and subsequent to this, not only are the first recognition mark 12 and the second recognition mark 13 recognized by the recognition means 7, but a preceding control parameter inputted to a recognition means movement control system is corrected and updated based on a prescribed control parameter obtained by the recognition operation.

On this occasion, since the first recognition mark 12 is recognized, the two-field recognition means 7 is, in advance of the mounting, subjected to movement control at the same stroke as when the two-field recognition means 7 recognizes a chip recognition mark (an alignment recognition mark) of a chip suction held by the head 2 and a substrate recognition mark (an alignment recognition mark) of a substrate supported on the substrate holding stage 1 below the head 2. In such a way, since all the recognition marks are recognized at the position of the same stroke, no influence of deflection due to a difference in load is exerted in recognition of the recognition marks.

In succession, after the two-field recognition means 7 is moved to the original retreat position from the mark recognition position between the head 2 and the calibration plate 16, the head 2 is lowered from the upper waiting position to thereby, cause the pressure surface 4a of the tool 4 of the head 2 is brought to a position close to or into contact under a slight pressure with the calibration plate 16.

Then, not only are the first recognition mark 12 and the second recognition mark 13 recognized by the third recognition means 20 from below the calibration plate 16, but a preceding control parameter inputted to the recognition means movement control system is further corrected and updated based on a prescribed control parameter obtained by the recognition operation.

Note that, for example, a discrepancy between an upper side optical axis 10 of the two-field recognition means 7 and a lower side optical axis 11 thereof is obtained by the series of recognition operations of the first recognition mark 12 and the second recognition mark 13, a preceding control parameter is correction updated based on an obtained prescribed control parameter.

In the present invention, calibration is in such a way performed at two stages including calibration with the two-field recognition means 7 and calibration with the third recognition means 20. Therefore, calibration can be performed with a higher precision than in a conventional practice while preventing complexity in the movement steps of recognition means.

Furthermore, in the present invention, as described above, since movement control on recognition means is completed a smaller number of times, a time necessary for calibration can be reduced.

Note that such calibration is performed in any suitable manner when required during the course of successive mounting of chips on a substrate (not shown) supported on the substrate holding stage 1. Furthermore, calibration with the third recognition means 20 is performed in order to deal with thermal deformation of the stage or the head, which has only to be performed at a frequency smaller than calibration with the two-field recognition means 7 having a high frequency of deformation in its optical system.

The above described mounting is performed at a position different from a position at which calibration is actually performed, that is after the substrate holding stage 1 is moved to the position of mounting. This is performed under driving control on the movable table 19, and after movement to the position of mounting, by the two-field recognition means 7, recognition is performed of the substrate recognition mark of a substrate vacuum suction held on the substrate holding stage 1 with the help of the suction hole 15 and of the chip recognition mark of a chip (not shown) vacuum suction held with the help of the suction hole 12 of the head 2.

The substrate holding stage 1 moves in a prescribed direction of the X and Y axis directions, that is not only translated but also rotated so as to cause no discrepancy in position between both recognition marks to thereby position the chip at a mounting position on the substrate; therefore, the mounting can be achieved in a prescribed manner by lowering the head 2.

While in the above paragraphs, description is given of the one embodiment, there is no problem as to which is performed ahead of the other, calibration with the third recognition means 20 or calibration with the two-field recognition means 7. Furthermore, not only may parallel calibration be performed with the two-field recognition means 7 and the third recognition means 20, but calibration with the third recognition means 20 may also be intermittently performed before or after calibration with the two-field recognition 7.

As for the head 2, not only may a heat tool having a heater be used, but a heat tool without a heater may also be used.

It is only required that the substrate holding stage 1 and the head 2 are capable of movement control thereon in a horizontal direction and a direction of rotation in a horizontal plane including the horizontal direction in terms of a relative positional relationship, in which sense, the substrate holding stage 1 may be mounted so as to be movable only in the X axis direction or the Y axis direction as far as the stage can move around in the horizontal plane, in which case, the head 2 has only to be mounted so as to be movable in the Y axis direction or the X axis direction and besides, so as to be rotatable.

Mounting of the calibration plate 16 to the substrate holding stage 1 may be performed in any mode as far as the third recognition means 20 can recognize the second recognition mark 13 and the first recognition mark 12 from below the calibration plate 16.

While the two-field recognition means 7 is generally provided in a mode in which translation control and/or upward/downward movement is enabled thereon, the two-field recognition means 7 may be provided in any of modes in which translation control, rotation control and upward/downward movement control are enabled thereon, in which translation control and upward/downward movement control are enabled thereon and in which rotation control and upward/downward movement control are enabled thereon.

Figure 3:
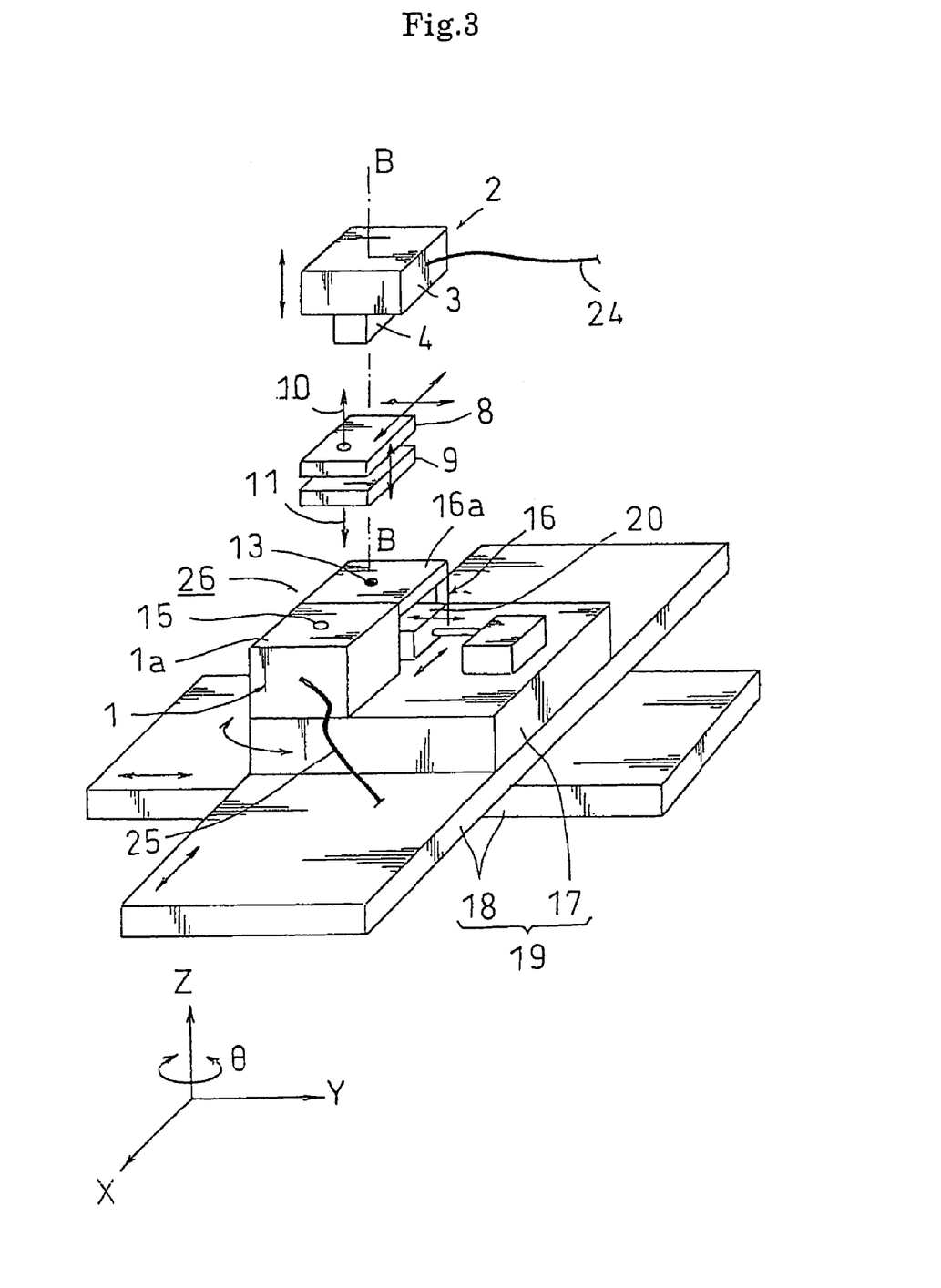
FIG. 3 is a perspective view showing another state of recognizing the second recognition mark in a chip mounting device.
Figure 4:
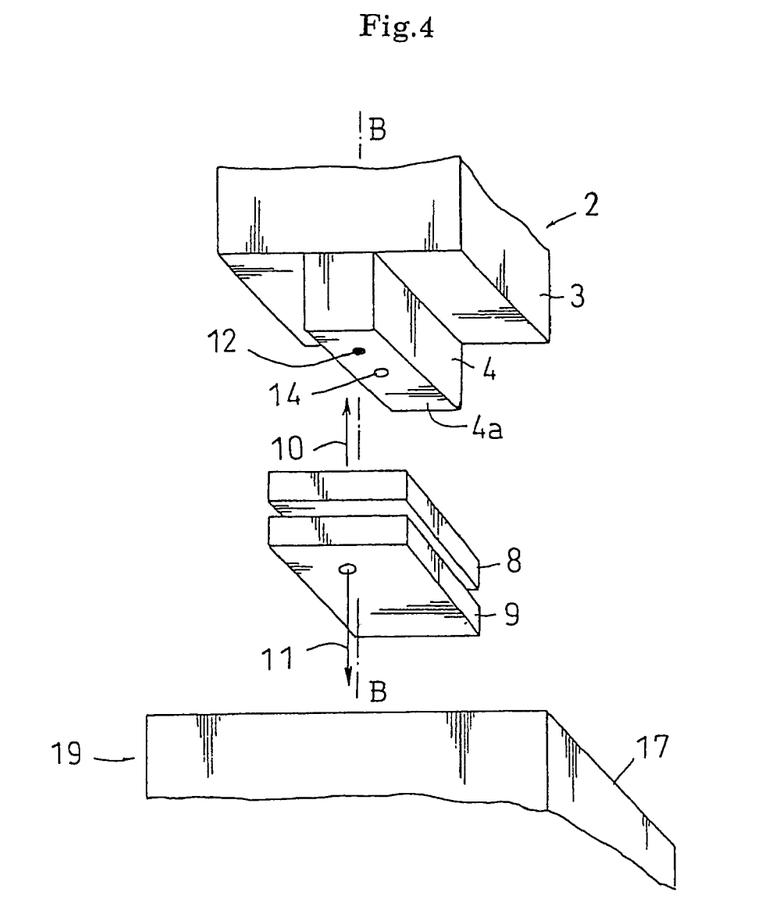
FIG. 4 is a perspective view showing another state of recognizing the first recognition mark in a chip mounting device.

Furthermore, the two-field recognition means 7, as shown in FIGS. 3 and 4, may be provided in any of modes in which the first recognition means 8 and the second recognition means 9 constituting the two-field recognition means 7 are separated and each is capable of translation control and/or upward/downward movement; translation control, rotation control and upward/downward movement control; translation control and upward/downward movement control; or rotation control and upward/downward movement control thereon independently of the other, or alternatively, both are capable of the above combinations thereon simultaneously in the same direction.

The movable table 19 may adopt any of configurations in which it is simply the translation table 18 or the rotation table 17, or alternatively, the translation table 18 and the rotation table 17 are combined, in which any of them is disposed on the other, without causing a trouble.

Furthermore, the movable table 19 may also be provided in any of modes in which translation control and/or upward/downward movement is enabled thereon, in which translation control, rotation control and upward/downward movement control are enabled thereon, in which translation control and upward/downward movement control are enabled thereon and in which rotation control and upward/downward movement control are enabled thereon.

While the substrate holding stage 1 and the calibration plate 16 are provided on the same rotation table 17, they may be provided in any of modes in which each is capable of translation control and/or rotation control; translation control, rotation control and upward/downward movement control; translation control and upward/downward movement control; or rotation control and upward/downward movement control thereon independently of the other, or alternatively, both are capable of the above combinations thereon simultaneously in the same direction.

Note that the calibration plate 16 is made of a see-through member or a transparent member, and while in a case where a CCD camera or the like is used as the third recognition means, at least a portion through which an optical axis passes is made of a transparent member such as a glass member, in a case where an infrared camera, an X ray camera or the like is used as the third recognition means, the calibration plate 16 may be provided in any of modes as far as at least a portion through which an optical axis passes is made of a material that is suitable for a kind or nature of a light source, which is a material through which a radiation beam can pass, such as germanium, silicon or the like.

The head 2 may be provided in any of modes, not limitedly in which upward/downward movement control is enabled thereon, but also in which translation control and upward/downward movement are enabled thereon, in which translation control, rotation control and upward/downward movement are enabled thereon, and in which rotation control and upward/downward movement control are enabled thereon.

A configuration may be adopted in which only the calibration plate 16 in the shape of a gate opening so as to form a passage for the third recognition means 20 is mounted without mounting the substrate holding stage 1, and not only is the calibration plate 16 used as a substrate holding stage (on a surface of which a substrate is set), but the second recognition mark provided on the upper surface and the first recognition mark provided on the head are also recognized, from below, by the third recognition means 20, in which case, the third recognition means 20 may be stationary or freely movable.

The first recognition mark recognized by the first recognition means 8 or the third recognition means 20 is not limited to the recognition mark 12 provided on the pressure surface 4a of the tool 4, which is the tip end of the head 2, but the suction hole 14 may also be used as a recognition mark instead of the recognition mark 12.

Figure 5:
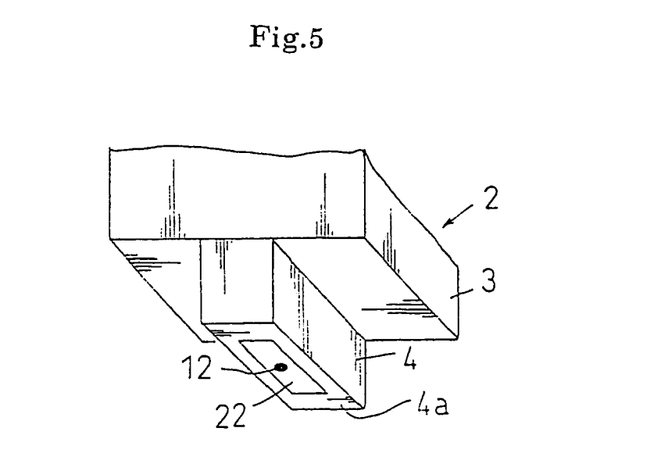
FIG. 5 is a perspective view showing a state where a head holds a chip.

Furthermore, as shown in FIG. 5, a configuration may be adopted in which the first recognition mark 12 is put on the chip 22 held on the tool pressure surface 4a and recognized as a recognition mark.

Figure 6:
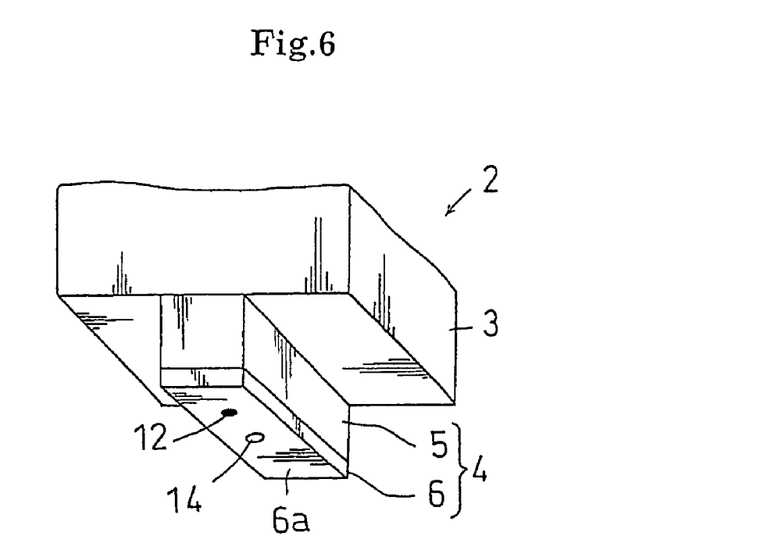
FIG. 6 is a perspective view showing a state where a tool of the head is constituted of a holder and an attachment.
Figure 7:
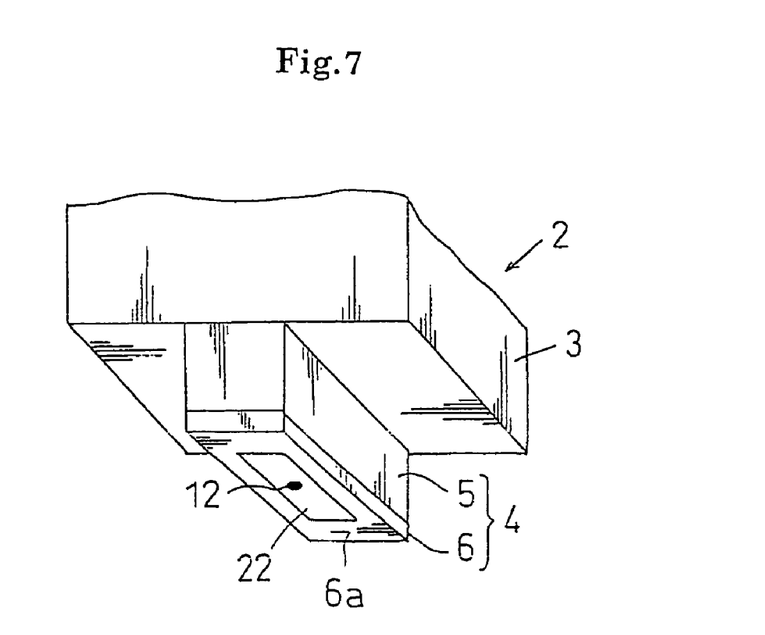
FIG. 7 is a perspective view showing a state of holding a chip with the head of FIG. 6.

The tool 4 may be provided in a mode in which, as shown in FIG. 6, it is constituted of a holder 5 and an attachment 6 and in a case where a chip is held in this mode, the chip is held on a pressure surface 6a of the attachment 6 (see FIG. 7).

On this occasion, the attachment 6 provided on the lower surface of the holder 5 is mounted so as to be exchangeable (freely mountable or demountable) (for example, exchangeable using holding means such as of a suction holding type) in which an attachment 6 can be selectively used according to a kind or size of a chip, or a mounting space on a substrate.

Note that any of modes may be adopted in which a heating means is provided in the holder 5 and in which no heating means is provided in the holder 5.

According to modes described above, the first recognition mark may be a first recognition mark 12 provided on the pressure surface 6*a* of the attachment 6 or the suction hole 14 as a recognition mark to be recognized. That is, the attachment 6 may be provided only with the chip holding suction hole 14, in which case the suction hole 14 is used as the first recognition mark.

Furthermore, as shown in FIG. 7, a mode may also be adopted in which the first recognition mark 12 is provided on a chip 22 disposed on the pressure surface 6*a* of the attachment 6 and recognized as a recognition mark.

In a case where the suction hole 14 for holding a chip on the tool pressure surface 4*a* or the pressure surface 6*a* of the attachment 6 is recognized as the first recognition mark, a mode may be adopted in which no registration mark 12 is put.

Note that a chip indicates any of objects in all forms on the side bonded to a substrate, such as an IC chip, a semiconductor chip, a wafer and an optical element, regardless of a kind or a size.

Figure 8:
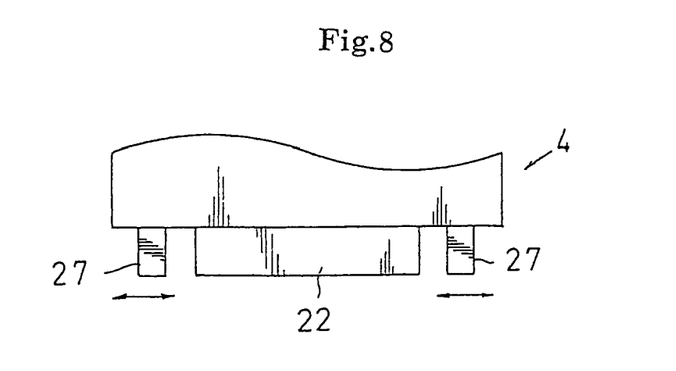
FIG. 8 is a side view showing a state where a head holds a chip with a pair of movable claws.
Figure 9:
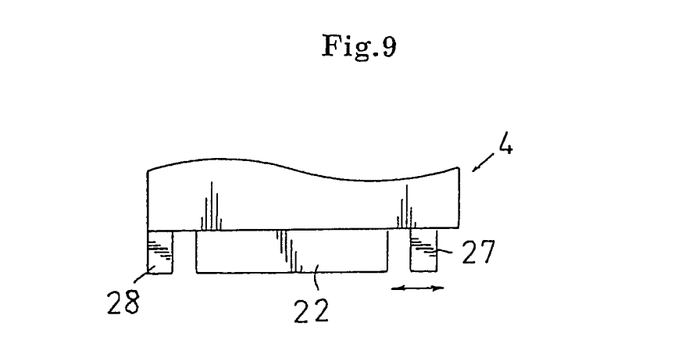
FIG. 9 is a side view showing a state where a head holds a chip with a stationary claw and a movable claw.

As means holding a chip on the tool pressure surface 4*a* or the attachment pressure surface 6*a*, any of holding means may be adopted, such as not only suction holding means using a suction hole, but also electrostatic holding means using an effect of static electricity, magnetic holding means using an effect of a magnet or magnetism, mechanical means holding a chip by pressing both sides thereof with two movable claws as shown in FIG. 8, mechanical holding means holding a chip by pressing one side thereof in a direction toward a stationary claw with a movable claw as shown in FIG. 9, and the like.

While the second recognition mark recognized by the second recognition means 9 or the third recognition means 20 is a recognition mark put on an upper surface 16*a* of the calibration plate 16, a mode may be adopted in which the suction hole 15 provided on the upper surface 1*a* of the substrate holding stage 1 is recognized as a recognition mark using a construction and a means in which the third recognition means can recognize a recognition mark from below the upper surface 1*a* of the substrate holding stage 1 by a contrivance to change the substrate holding stage 1 in the shape of a block to a construction such as a gate opening or the like.

On this occasion, the upper surface of the stage 26 may be, in a case where a CCD camera or the like is used as the third recognition means 20 similar to the case of the calibration plate 16*a*, made of a transparent member such as a member of glass in at least a portion through which an optical axis passes, or alternatively, in a case where an infrared camera, an X ray camera or the like is used as the third recognition means, made of any material as far as being suitable for a kind and nature of a light source, which is a material capable of transmitting a radiation beam, such as glass of a transparent plate, germanium or silicon.

Figure 10:
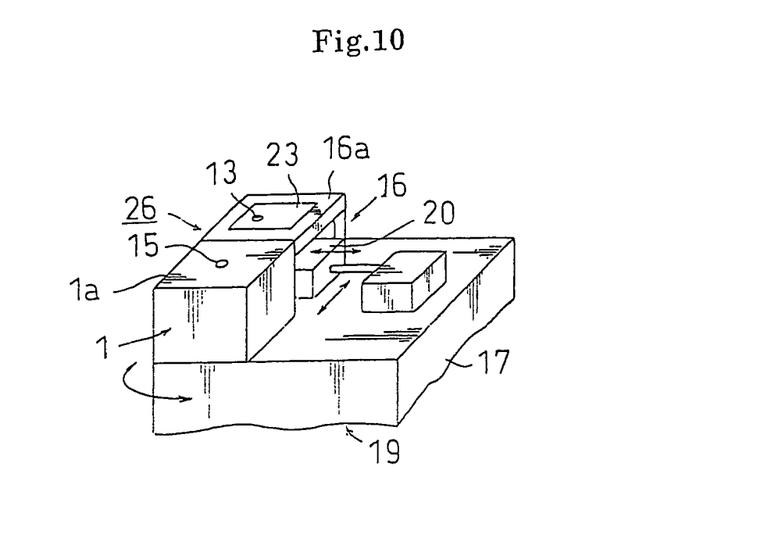
FIG. 10 is a perspective view showing a state of holding a substrate with a calibration plate of a stage of a partially see-through type.
Figure 11:
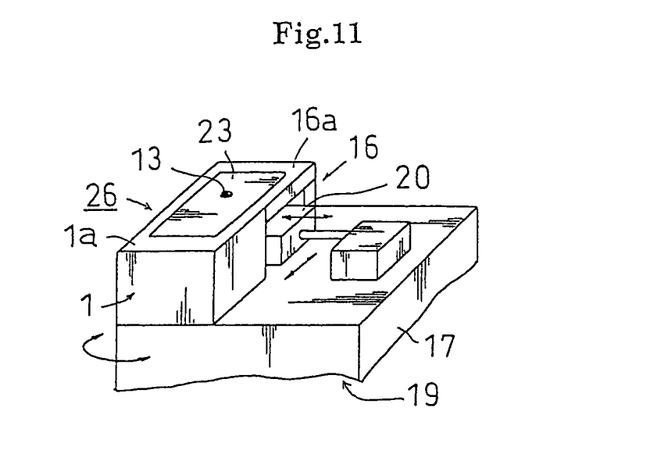
FIG. 11 is a perspective view showing a state of holding a substrate with a substrate holding stage and a calibration plate of a stage of a partially see-through type.
Figure 12:
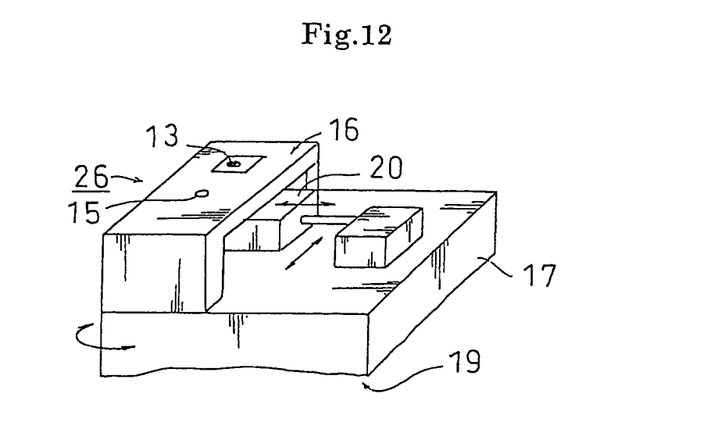
FIG. 12 is a perspective view showing a state of mounting a calibration plate on a stage of a wholly non-see-through type.

While in FIG. 10, there is shown a substrate 23 held on the upper surface 16*a* of the calibrating plate 16; in FIG. 12, there is shown a construction in which the calibration plate 16 is provided on the upper surface of the stage 26; and in FIG. 11, there is shown a substrate 23 supported on both upper surfaces 1*a* and 16*a*, a mode may be adopted in which a mark provided on the substrate 23 is used as the second recognition mark.

Figure 13:
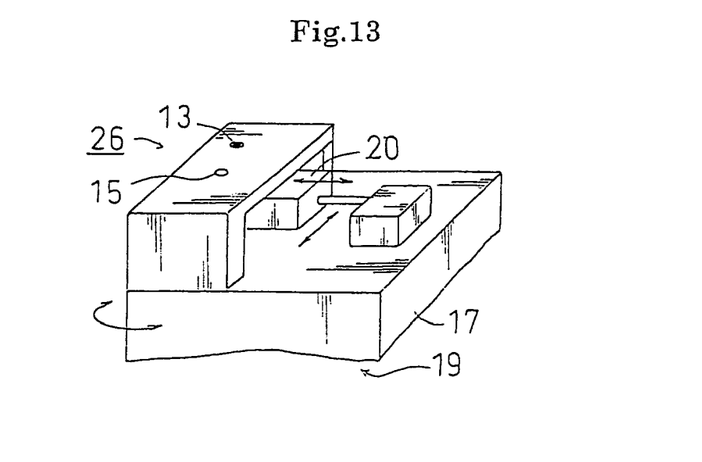
FIG. 13 is a perspective view showing a stage of a wholly see-through type.
Figure 14:
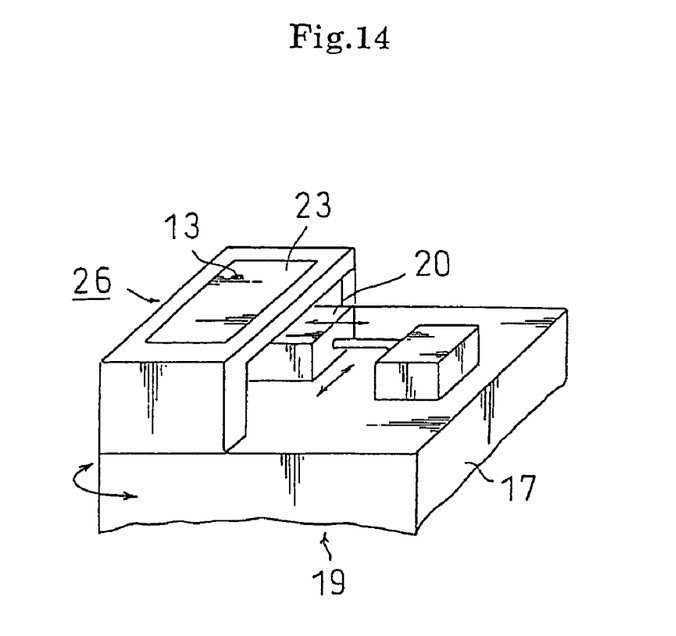
FIG. 14 is a perspective view showing a state of holding a substrate with the stage of FIG. 13.

In FIGS. 12 and 13, there is shown a stage 26 obtained by integrating the substrate holding stage 1 and the calibration plate 16 into a single piece and in FIG. 14, there is shown the substrate 23 supported on the upper surface of the stage 26. In FIG. 13, there is shown a mode in which the suction hole 15 is used as a recognition mark when the second recognition mark is not provided. Furthermore, in a case where the substrate 23 is supported as in FIG. 14, the second recognition mark 13 is provided on the substrate 23.

Note that in the cases of FIGS. 13 and 14, materials of the substrate 23 and the stage 26 may be any material as far as being suitable for a kind and nature of a light source of the third recognition means.

In a case where this scheme is employed, by performing mounting after calibration and alignment are performed in a state where a chip held by the head 2 is at a position close to or brought into contact at a degree of just touching with the substrate 23, not only can mounting with a limitlessly high precision be realized, but alignment of a chip held by the head 2 can also be performed even during mounting on the substrate 23; therefore, substrates rejected as NG (defective products) can be reduced in number.

A substrate indicates any of modes (objects) in all forms on the side to which a chip is bonded, such as a resin substrate, a glass substrate, a film substrate, a chip and a wafer, regardless of a kind or a size.

As means holding the substrate 23 on the upper surface 1*a* of the substrate holding stage 1, the upper surface 16*a* of the calibration plate 16 or the upper surface of the stage 26, any of holding means may be adopted, such as not only suction holding means using a suction hole, but electrostatic holding means using an effect of static electricity, magnetic holding means using an effect of a magnet or magnetism, mechanical means holding a chip by pressing both sides thereof with two movable claws as shown in FIG. 8, mechanical holding means holding a chip by pressing one side thereof in a direction toward a stationary claw with a moving claw as shown, and the like.

Figure 15:
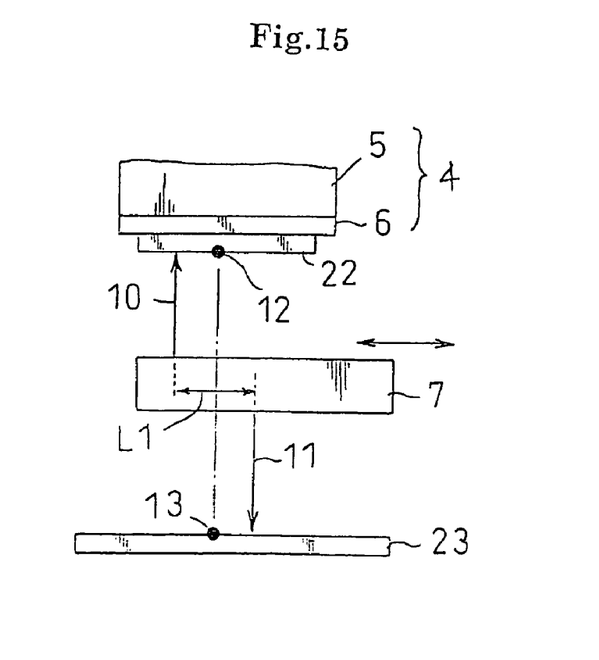
FIG. 15 is a view showing a state of misalignment between optical axes in two-field recognition means.
Figure 16:
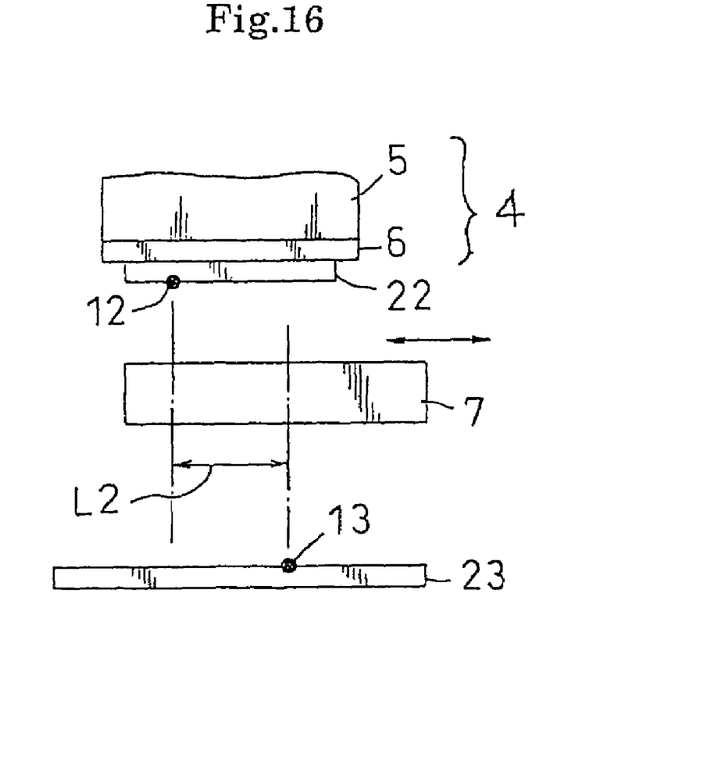
FIG. 16 is a view showing a positional shift occurring when a head holds a chip.
Figure 17:
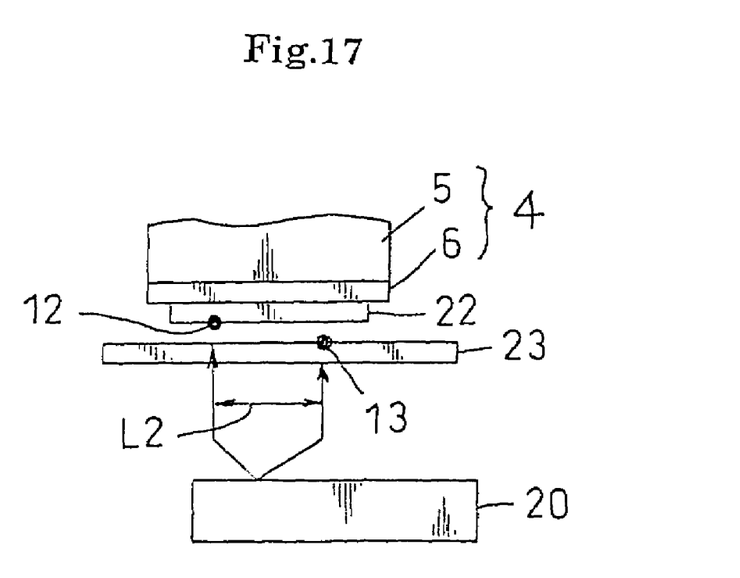
FIG. 17 is a view showing a state of recognizing a first recognition mark and a second recognition mark by third recognition means.

In FIGS. 15, 16 and 17, there are shown means capable of calibration in a case where a recognition mark is put on a chip and/or a substrate having a different recognition position in each calibration.

While in the two-field recognition means 7, as shown in FIG. 15, the upper optical axis 10 and the lower optical axis 11 is ideally aligned on the same vertical axial center line, there is a discrepancy L1 between optical axes since both axes are not on the same vertical axial center line for reasons associated with fabrication.

Since a discrepancy L2 is generated by a positional shift occurring when the chip 22 is held on the tool 4 as shown in FIG. 16 and a positional shift occurring when a substrate is held on a stage, two factors of the discrepancy L1 and the discrepancy L2 are included in the two-field recognition means 7.

In contrast to this, since the third recognition means 20 has, as shown in FIG. 17, a single field of view, the third recognition means 20 recognizes only a factor generating the discrepancy L2 caused by a positional shift occurring when a chip 22 is held by the tool 4 and a positional shift occurring when a substrate is supported on a stage in a state where the chip 22 is at a position close to or brought into contact at a degree of touching with the substrate 23.

That is, the discrepancy L1 required in calibration can be obtained by obtaining a difference between discrepancies recognized by the two-field recognition means 7 (recognizing the sum of the discrepancies L1 and L2) and the third recognition means 20 (recognizing the discrepancy L2).

In the present invention, the following modes are included in connection to combinations of recognition marks on the head side and recognition marks on the stage side:

(1) modes of combinations of the first recognition mark 12 put on the tool pressure surface 4a with each of (a) to (j) described below, (2) modes of combinations of the suction hole 14 provided on the tool pressure surface 4a with each of (a) to (j) described below, (3) modes of combinations of the first recognition mark 12 put on the chip 22 held by the tool pressure surface 4a with each of (a) to (j) described below, (4) modes of combinations of the first recognition mark 12 put on a calibration tool held by the tool pressure surface 4a with each of (a) to (j) described below, (5) modes of combinations of the first recognition mark 12 put on the attachment pressure surface 6a with each of (a) to (j) described below, (6) modes of combinations of the suction hole 14 provided on the attachment pressure surface 6a with each of (a) to (j) described below, (7) modes of combinations of the first recognition mark 12 put on the chip 22 held by the attachment pressure surface 6a with each of (a) to (j) described below, and (8) modes of combinations of the first recognition mark 12 put on the calibration tool held by the attachment pressure surface 6a with each of (a) to (j) described below, and (a) the second recognition mark 13 put on the calibration plate upper surface 16a (see FIG. 1), (b) the second recognition mark 13 put on the substrate 23 held by the calibration plate upper surface 16a (see FIG. 10), (c) the second recognition mark 13 put on the substrate 23 held by both of the calibration plate upper surface 16a and the substrate holding upper surface 1a (see FIG. 11), (d) the second recognition mark 13 put on the calibration plate upper surface 16a of the calibration plate 16 that is provided in part of the upper surface of the stage 26 of a wholly non-see-through type (see FIG. 12), (e) the second recognition mark 13 put on the substrate 23 held by the calibration plate upper surface 16a of the calibration plate 16 that is provided in part of the upper surface of the stage 26 of the wholly non-see-through type (a mode in which the second recognition mark 13 is not put in FIG. 12), (f) the second recognition mark 13 put on the calibration plate tool supported on the calibration plate upper surface 16a of the calibration plate 16 that is provided in part of the upper surface of the stage 26 of the wholly non-see-through type, (g) the second recognition mark 13 put on the upper surface of the stage 26 of a wholly see-through type (see FIG. 13), (h) the suction hole 15 being opened at the upper surface of the stage 26 of a wholly see-through type (a mode in which the second recognition mark 13 is not put in FIG. 13), (i) the second recognition mark 13 put on the substrate 23 held on the upper surface of the stage 26 of the wholly see-through type (see FIG. 14), and (j) the second recognition mark 13 put on the calibration tool supported on the upper surface of the stage 26 of a wholly see-through type.

Note that the calibration tool is an object in the same shape as or in a shape analogous to the chip 22 or the substrate 23.

INDUSTRIAL APPLICABILITY

As described above, the present invention is suitable for performing calibration with a high precision in a device mounting a chip such as an IC chip, a semiconductor chip, a wafer and an optical element on a substrate such as a resin substrate, a glass substrate, a film substrate, a chip and a wafer.

The invention claimed is:

1. A calibration method in a chip mounting device, comprising the steps of:
    recognizing a first recognition mark and a second recognition mark to acquire a prescribed control parameter in a state where first recognition means and second recognition means have been moved into between a head, having a function to hold a chip, and provided with the first recognized mark and a stage, disposed below the head, having a function to hold a substrate, and provided with the second recognition mark, the first recognition mark being recognized by the first recognition means and the second recognition mark being recognized by the second recognition means when the first recognition means and the second recognition means are positioned between the head and the stage;
    recognizing both of the first recognition mark and the second recognition mark with third recognition means to acquire a prescribed control parameter in a state where the first recognition mark and the second recognition mark are close to or in contact with each other, obtained by moving the head toward the stage side; and
    correcting and updating a control parameter of a recognition means movement control system based on the prescribed control parameters.

2. The calibration method in a chip mounting device according to claim 1, further comprising the step of:
    intermittently correcting and updating the control parameter based on recognition of the first recognition mark and the second recognition mark performed by the third recognition means before or after the step of correcting and updating the control parameter based on recognition of the first recognition mark and the second recognition mark performed by the first recognition means and the second recognition means.

* * * * *